(12) United States Patent
Wu et al.

(10) Patent No.: US 8,042,083 B2
(45) Date of Patent: Oct. 18, 2011

(54) METHODS AND SYSTEMS FOR FPGA REWIRING

(75) Inventors: Yu-Liang Wu, Hong Kong (CN); Wai Chung Tang, Hong Kong (CN); Wing Hang Lo, Hong Kong (CN)

(73) Assignee: The Chinese University of Hong Kong, Hong Kong (CN)

( * ) Notice: Subject to any disclaimer, the term of this patent is extended or adjusted under 35 U.S.C. 154(b) by 199 days.

(21) Appl. No.: 12/472,210

(22) Filed: May 26, 2009

(65) Prior Publication Data

US 2009/0300571 A1 Dec. 3, 2009

Related U.S. Application Data

(60) Provisional application No. 61/058,142, filed on Jun. 2, 2008.

(51) Int. Cl.
*G06F 17/50* (2006.01)
(52) U.S. Cl. ......... 716/116; 716/104; 716/111; 716/119
(58) Field of Classification Search .................. 716/114, 716/115, 104, 111, 116, 119
See application file for complete search history.

(56) References Cited

U.S. PATENT DOCUMENTS

2007/0277161 A1* 11/2007 Herbordt et al. .............. 717/140
2009/0249276 A1* 10/2009 Wu et al. ......................... 716/16

OTHER PUBLICATIONS

Chang, et al. "Postlayout Logic Restructuring Using Alternative Wires", *IEEE*, vol. 16, No. 6, Jun. 1997, pp. 587-596.

Chen, et al., "DAOmap: A Depth-optimal Area Optimization Mapping Algorithm for FPGA Designs", *Proc. Int'l Conf. on Computer-aided Design*, 2004, pp. 752-759.
Cong, et al., "A New Enhanced SPFD Rewiring Algorithm", *Proc. IEEE/ACM International Conference on Computer-aided Design '02*, San Jose, CA USA, Nov. 2002, pp. 672-678.
Ling, et al., "FPGA Technology Mapping: A Study of Optimality", $42^{nd}$ *ACM/IEEE Design Automation Conference*, 2005, pp. 427-432.
Manohararajah, et al., "Heuristics for Area Minimization in LUT-Based FPGA Technology Mapping", *IEEE*, vol. 25, No. 11, Nov. 2006, pp. 2331-2340.
Marquardt, et al., "Timing-Driven Placement for FPGAs", *Proc. Int'l Symp. on Field Programmable Gate Arrays*, Monterey, CA USA, Feb. 2000, pp. 203-213.
Yamashita, et al., "A New Method to Express Functional Permissibilities for LUT based FPGAs and its Applications", *Proc. IEEE/ACM International Conference on Computer-aided Design '96*, San Jose, CA USA, Nov. 1996, pp. 254-261.
Betz et al, "VPR: A New Packing, Placement and Routing Tool for FPGA Research", 1997 International Workshop on Field Programmable Logic and Applications.

(Continued)

*Primary Examiner* — Nghia Doan
*Assistant Examiner* — Brian Ngo
(74) *Attorney, Agent, or Firm* — Knobbe Martens Olson & Bear LLP

(57) ABSTRACT

There are disclosed a method and system for FPGA rewiring of a circuit. The method comprises: mapping the circuit into a first circuit, the first circuit being logically represented with a plurality of Look-Up Tables; rewiring the first circuit to obtain a second circuit, a mapping area of the second circuit being less than that of the first circuit; mapping the second circuit into a third circuit, the third circuit being logically represented with less Look-Up Tables than the first circuit; and routing the third circuit to generate a FPGA architecture file related to the circuit.

24 Claims, 8 Drawing Sheets

OTHER PUBLICATIONS

C. W. Chang and M. Marek-Sadowska, "Single-Pass Redundancy Addition and Removal," in *Proc. IEEE/ACM International Conference on Computer-aided Design'01*, San Jose, CA, USA, Nov. 2001, pp. 606-609.

C. W. Chang and M. Marek-Sadowska, "Who are the Alternative Wires in Your Neighborhood?" in *Proc. ACM Greak Lakes Symposium on VLSI'01*, West Lafayette, USA, Mar. 2001, pp. 103-108.

S. C. Chang, L. P. v. Ginneken, and M. Marek- Sadowska, "Fast Boolean Optimization by Rewiring," in *Proc. IEEE/ACM International Conference on Computer-aided Design'96*, San Jose, CA, USA, Nov. 1996, pp. 262-269.

Chang et al., "Circuit Optimization by Rewiring", IEEE Transactions on Computers, vol. 48, No. 9, Sep. 1999. pp. 962-970.

Chang et al., "Perturb and Simplify: Multilevel Boolean Network Optimizer", IEE Transactions on Computer-Aided Design of Integrated Circuit and Systems, vol. 15, No. 12, Dec. 1996, pp. 1494-1504.

K. T. Cheng and L. A. Entrena, "Multi-Level Logic Optimization by Redundancy Addition and Removal," in *Proc. IEEE European Design Automation Conference'93*, Paris, France, Feb. 1993, pp. 373-377.

Wu et al., "Further Improve Circuit Partitioning Using GBAW Logic Perturbation Techniques", IEEE Transactions on Very Large Scale Integration (VLSI) Systems, vol. 11, No. 3, Jun. 2003, pp. 451-460.

Entrena et al., "Combinational and Sequential Logic Optimization by Redundancy Addition and Removal", IEEE Transactions on Computer-Aided Design of Integrated Circuits and Systems, vol. 14, No. 7, Jul. 1995, pp. 909-916.

Iyer et al., "Fire: A Fault-Independent Combinational Redundancy Identification Algorithm", IEEE Transactions on Very Large Scale Integration (VLSI) Systems, vol. 4, No. 2, Jun. 1996, pp. 295-301.

S. Sinha and R. K. Brayton, "Implementation and use of SPFDs in Optimizing Boolean Networks," in *Proc. IEEE/ACM International Conference on Computer-aided Design'98*, San Jose, CA, USA, Nov. 1998, pp. 103-110.

Y. L. Wu, W. N. Long, and H. B. Fan, "A Fast Graph-Based Alternative Wiring Scheme for Boolean Networks," in *Proc. IEEE International Conference on VLSI Design'00*, Calcutta, India, Jan. 2000, pp. 268-273.

\* cited by examiner (a)  (b)

US 8,042,083 B2

METHODS AND SYSTEMS FOR FPGA REWIRING

RELATED APPLICATIONS

This application claims the benefit of U.S. Provisional Patent Application No. 61/058,142, titled "METHODS FOR LOGIC PERTURBATION HELPING FROM NETLIST TO FINAL ROUTING FOR FPGAS", filed Jun. 2, 2008. The disclosure of the above-reference application is considered part of the disclosure of this application and is incorporated by reference herein.

TECHNICAL FIELD

The present application relates to a Field Programmable Gate Array (FPGA) rewiring technique.

BACKGROUND

Rewiring is used to replace a wire/gate with other wires/gates without changing the logic functions of a circuit. Applying rewiring for a circuit may incrementally refine the structure of the circuit based on its logical and physical information to improve many EDA (Electronic Design Automatic) objectives comprising circuit area, routability, and performance.

Known rewiring techniques may be classified into three groups: the Automatic Test Pattern Generation (ATPG) based rewiring method, the Set of Pairs of Functions to be Distinguished (SPFD) based method, and the Graph-Based Alternative Wiring (GBAW) method.

However, rewiring that may reduce the resources of a circuit is desirable in the art.

SUMMARY

In one aspect, there is disclosed a method for FPGA rewiring of a circuit. The method comprises:
 mapping the circuit into a first circuit, wherein the first circuit is logically represented with a plurality of Look-Up Tables;
 rewiring the first circuit to obtain a second circuit, wherein a mapping area of the second circuit is less than that of the first circuit;
 mapping the second circuit into a third circuit, wherein the third circuit is logically represented with less Look-Up Tables than the first circuit; and
 routing the third circuit to generate an FPGA architecture file related to the circuit, wherein the circuit can be re-constructed based on the generated file.

In the other aspect, there is disclosed a system for FPGA rewiring of a circuit. The system comprises:
 a first mapping module configured to map the circuit into a first circuit, wherein the first circuit is logically represented with a plurality of Look-Up Tables;
 a rewiring module configured to rewire the first circuit to obtain a second circuit, wherein a mapping area of the second circuit is less than that of the first circuit;
 a second mapping module configured to map the second circuit into a third circuit, wherein the third circuit is logically represented with less Look-Up Tables than the first circuit; and
 a routing module configured to route the third circuit to generate an FPGA architecture file related to the circuit, wherein the circuit can be re-constructed based on the generated file.

DETAILED DESCRIPTION

Hereinafter, implementations will be described in detail with reference to the accompanying drawings.

Figure 1:
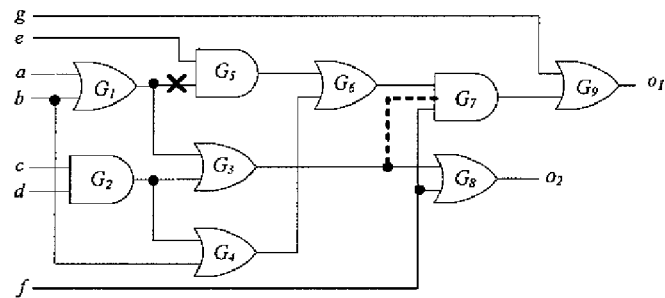
FIG. 1 demonstrates rewiring on a Boolean network of a circuit.
Figure 2:
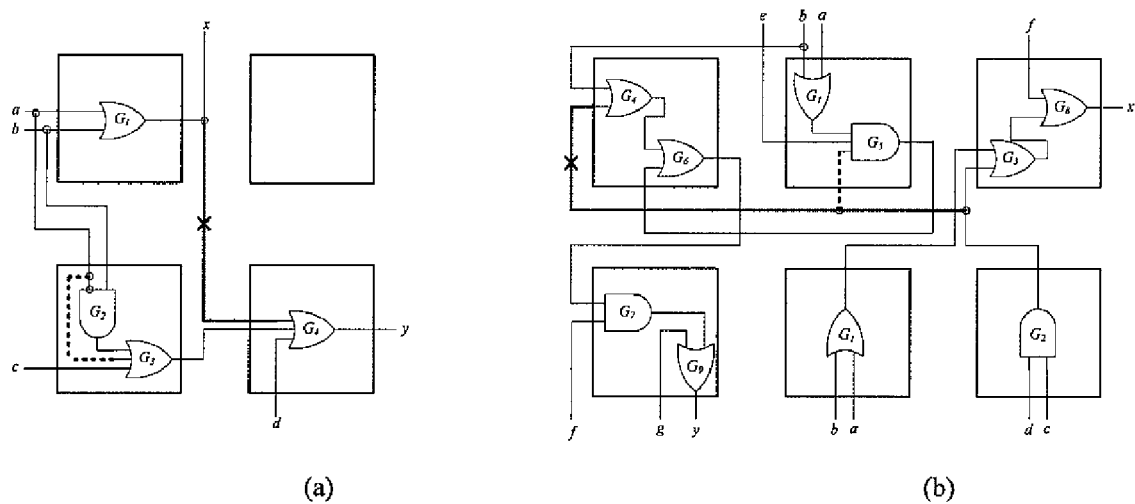
FIG. 2(a) demonstrates logic shifting from critical LUT-external to free LUT-internal resources, and FIG. 2(b) demonstrates logic shifting from long LUT-external to short LUT-external resources.

The basic idea of the ATPG-based rewiring technique is to add a redundant wire/gate in a circuit to make other wires/gates redundant and removable. Rewiring is used to find alternative wires for all nets in the circuit. Herein, a net refers to a wire between two LUTs (look-up table). A wire/gate is redundant if its addition or removal does not change the logic function of a Boolean network for the circuit. For example, as shown in FIG. 1, when a redundant wire $G_3 \rightarrow G_7$ is added, a wire $G_1 \rightarrow G_5$ will become redundant, and thus removable. FIGS. 2(a) and 2(b) illustrate how postlayout FPGA logic perturbations (logic shifting) can be used to affect performance of a circuit. As shown in FIG. 2(a), a target net $G_1 \rightarrow G_4$ is replaced by an internal wire whose source gate and sink gate are in the same LUT. As shown in FIG. 2(b), a longer net $G_2 \rightarrow G_4$ is substituted by a shorter net $G_2 \rightarrow G_5$. In both cases, routing becomes easier, and net delays can be reduced.

Figure 3:
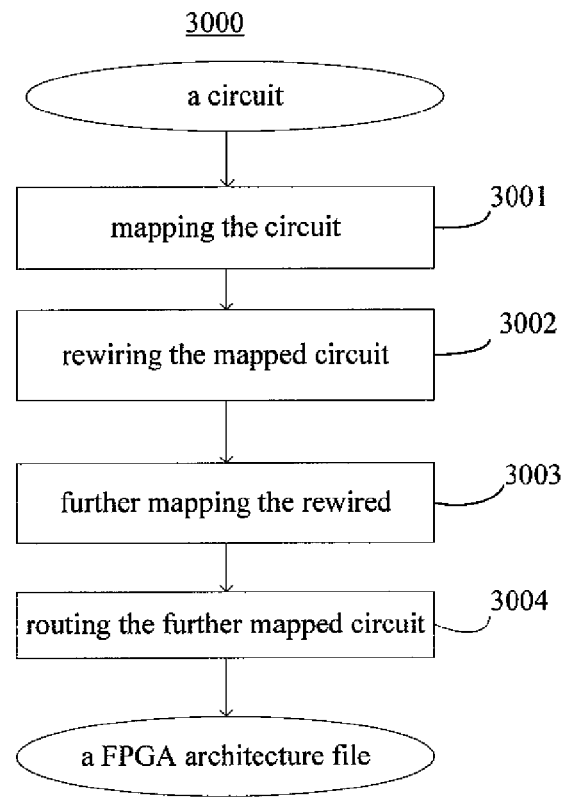
FIG. 3 demonstrates a flow chart of the FPGA rewiring method according to an embodiment.

Referring to FIG. 3, there is shown an FPGA rewiring process 3000 according to an embodiment. At step 3001, a circuit is mapped into a first circuit logically represented with a plurality of Look-Up Tables (LUTs) according to conventional means. At step 3002, the first circuit is rewired to a second circuit which has a reduced mapping area, wherein the mapping area of the circuit is reduced when less LUTs are contained in the circuit. In this step, logical information of the circuit is taken into account, and all wires between two LUTs with alternative wires will be assessed. A transformation from a target wire to an alternative wire will be executed if the mapping area can be reduced. At step 3003, the rewired circuit is mapped into a third circuit which can be logically represented with less LUTs. At step 3004, the third circuit is routed to generate a final FPGA architecture file. Hereinafter, the step 3002 is described in detail at first.

Figure 4:
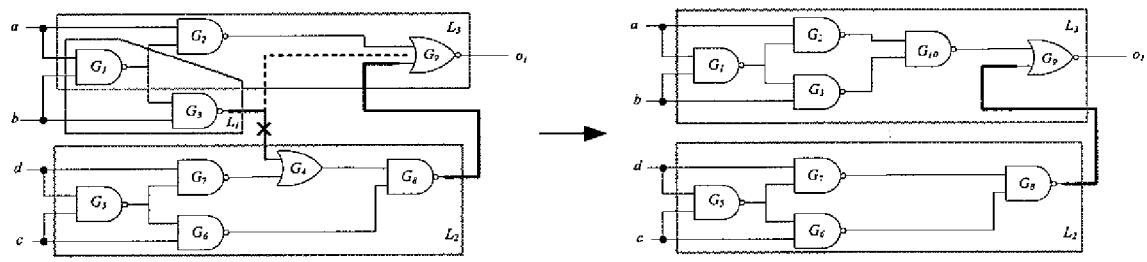
FIG. 4 demonstrates that the number of LUTs is reduced from 3 to 2 through exchanging external resource with free internal resource using rewiring (K=3).

It is known that any logic perturbation inside a LUT of a circuit is completely free, and it is possible to trade free internal resources for valuable external resources on an FPGA architecture of the circuit through perturbation. Such an example for technology mapping is shown in FIG. 4, wherein external wires are in bold for better illustration. A circuit is initially mapped into three LUTs by a well known mapping algorithm, DAOMap. The obtained mapping result is optimal if the structure of the circuit cannot be changed. However, an alternative wire $G_3 \rightarrow G_9$ being able to replace an external wire $G_3 \rightarrow G_4$ is identified using a conventional rewiring technique. Since the alternative wire is internal to a LUT, the area of the circuit can be reduced by a free logic transformation inside the LUT. The modified circuit can now be mapped into two LUTs only. It is considered that the circuit has a less mapping area when less LUTs are contained in the circuit.

Figure 5:
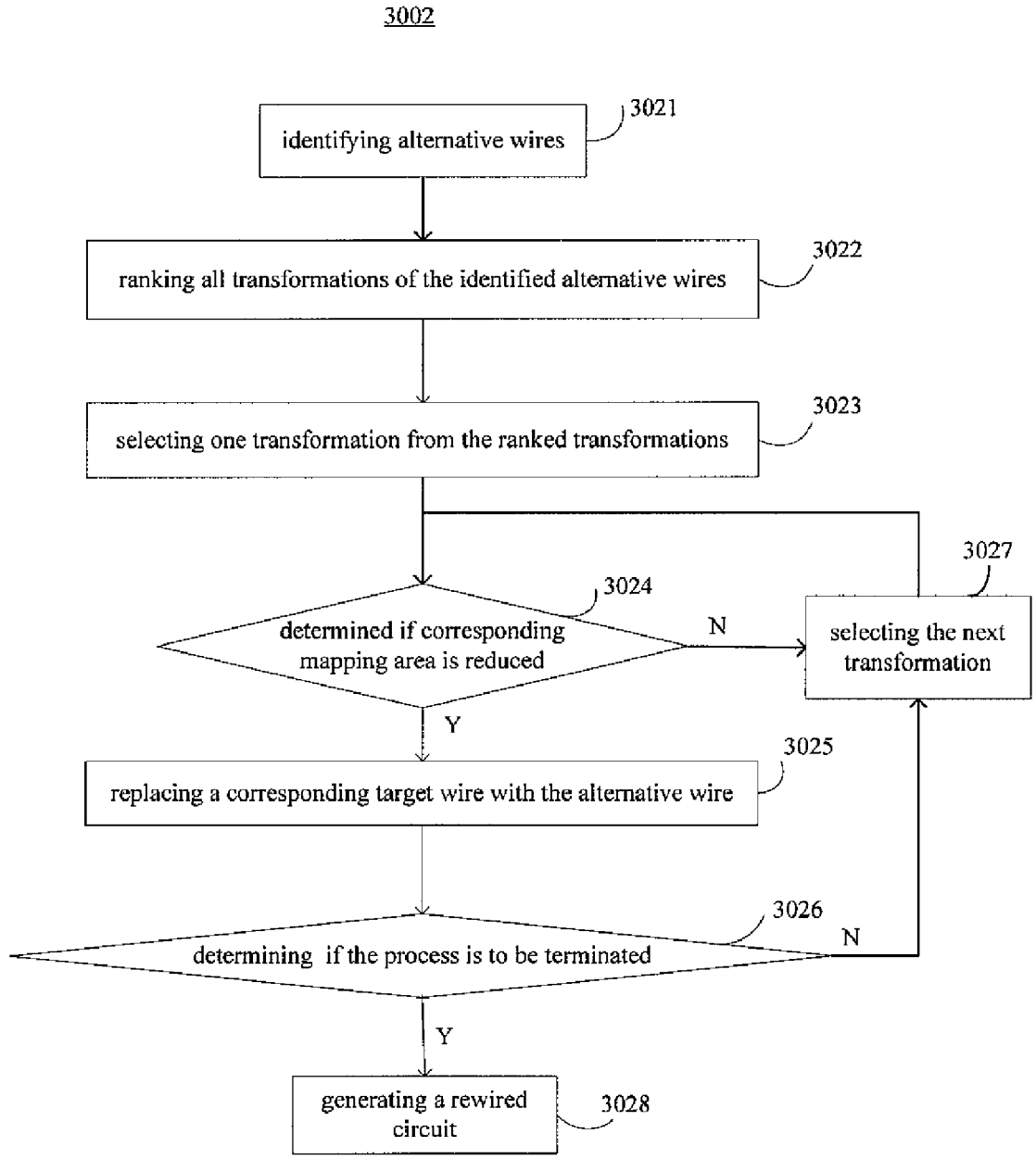
FIG. 5 demonstrates a detailed process for the step of rewiring of FIG. 3.

Referring to FIG. 5, there is illustrated a detailed process of the rewiring of the first circuit according to another embodiment. As shown in FIG. 5, alternative wires for a target wire are identified by using a conventional rewiring algorithm at step 3021. Herein, every wire in a circuit can be selected as a target wire. Each target wire and alternative wire pair is considered as a transformation. When the target wire is replaced by the alternative wire, the logic equivalence of the circuit will be maintained. At step 3022, all transformations are ranked in a descending order of scores calculated by an area efficiency heuristic, which will be explained hereinafter. At step 3023, a transformation with the highest score is selected. At step 3024, it is determined that if the mapping area corresponding to the transformation is to be reduced. If it is the case, the target wire is replaced with the alternative wire in the transformation at step 3025, and the process goes to the step 3026 to determine whether the process is to be terminated. If not, at step 3027 the next transformation is selected and the process returns back to step 3024; otherwise, the second circuit is generated at step 3028 and the process 3002 will be terminated. If it is determined that the mapping area corresponding to the transformation is not to be reduced at step 3024, the process directly goes to step 3026.

In particular, if all the transformations in the circuit are processed, it is determined at step 3026 that the process is to be terminated. Alternatively, the process 3002 will be terminated after a certain number of ranked transformations are found futile in reducing mapping area.

Hereinafter, the ranking of the transformations is to be described below. An efficient ranking of the transformations will allow area-reducing transformations to be searched for more quickly. In one embodiment, an area efficiency (AE) method proposed in IMap (V. Manohararajah, S. D. Brown, and Z. G. Vranesic, "*Heuristics for Area Minimization in LUT-based FPGA Technology Mapping,*" IEEE Trans. Computer-aided Design, vol. 25, pp. 2331-2340, November 2006) is applied for making efficient ranking. Hereinafter, applying the known method to make efficient ranking will be described in detail.

An area flow at a sink node v in a circuit is given by Equation (1) as follows:

$$af(v) = A_v + \sum_{u \in input(v)} af(u), \quad (1)$$

in which, u represents a source node associated with the node v, $A_v$ is the constant area of a gate v, af(u) is the area flow of gate u calculated from its fanins, and the area flow of primary inputs is 0.

Given a wire $w_t=(u, v)$, the area flow at the wire is defined as the difference of the area flows of the source node u and the sink node v, i.e., $af(w_t)=af(u) af(v)$. To persist a better wire ranking, for each transformation $(w_t, w_a)$, the different $af(w_a)-af(w_t)$ is considered as a score to rank all transformations identified from the rewiring algorithm. As target wire $w_t=(u, v)$ is removed, its area flow $af(w_t)$ will be re-distributed to the fanout of u, and it is thus desirable to remove a wire with a smaller area flow. In addition, when a new wire $w_a=(p, q)$ is added, the area flow on node p will be distributed to the new wire as well. In this case, all transformations can be ranked to have a score. A new wire with a higher area flow is desired to be added, and thus a transformation with a higher score should be used for area reduction earlier in the optimization process.

The heuristic ranking plays an important role in runtime reduction since a greedy approach is used in searching for useful transformations. According to an embodiment, the step 3024 is carried out by checking a mapping depth at each node in the circuit. If the mapping depth is to be reduced, the mapping area of the circuit may be considered to be reduced. This can prevent delay performance of the circuit from worsening in the routing phase due to the area optimization.

Figure 8:
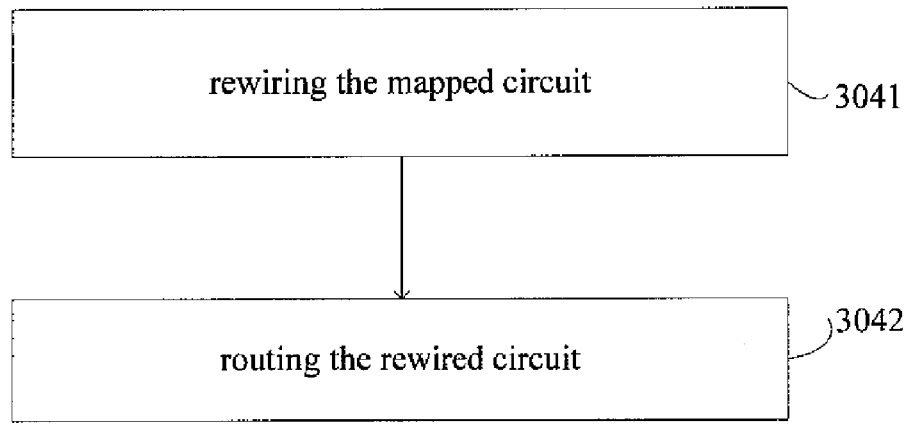
FIG. 8 demonstrates a detailed process for the step of routing of FIG. 3.

After the rewiring of the first circuit and the mapping of the second circuit a third circuit occupying less area is generated. Then, the step 3004 of routing the third circuit is implemented to generate a final FPGA architecture file. This step may further comprise a step 3041 of rewiring the third circuit to obtain a rewired circuit in which an FPGA delay can be reduced and a step 3042 of routing the rewired circuit to generate the FPGA architecture file, as shown in FIG. 8. In the step 3041, long nets are replaced by shorter alternative nets or internal wires so that logic perturbations are performed on the newly mapped circuit, and thus the critical path delay is to be reduced.

It is known that new LUTs may be required to maintain logic equivalence when an alternative wire is added into the mapped circuit to take place of a target wire. For example, in FIG. 6, $G_3 \rightarrow G_7$ is added to replace $G_1 \rightarrow G_5$. However, as $G_3$ is not an output node (root) of $L_3$, a new LUT with $G_3$ being the output node will be generated, which may not be feasible since there might be no available space for the added LUT. Therefore, a destination LUT expansion method is proposed, in which an alternative wire (u→v) satisfying the following condition is chosen: u is neither a primary input (PI) nor the root of a LUT. Given that $M_1$ is an input set of u's Transitive Fanin (TFI) cone inside a LUT containing u, and $M_2$ is an input set of a LUT containing v, $|M_1+M_2| \leq K$ (maximum input pin number of a LUT). For example, as shown in FIG. 7, the TFI cone of $G_6$ inside the LUT containing $G_6$ only covers $G_4$, $G_5$, and $G_6$. Given an alternative wire u→v, if $|M_1+M_2| \leq K$, the whole logic producing u can then be duplicated with the input set $M_1$ inside the LUT containing v. Thus, no extra LUT would be introduced. This process is called expansion.

Figure 6:
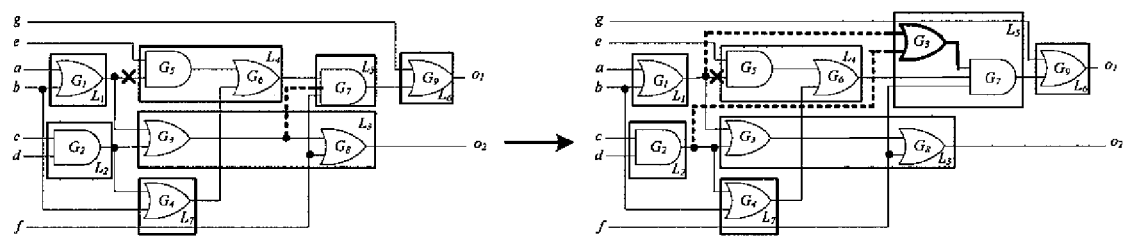
FIG. 6 demonstrates the destination LUT expansion (K=4).
Figure 7:
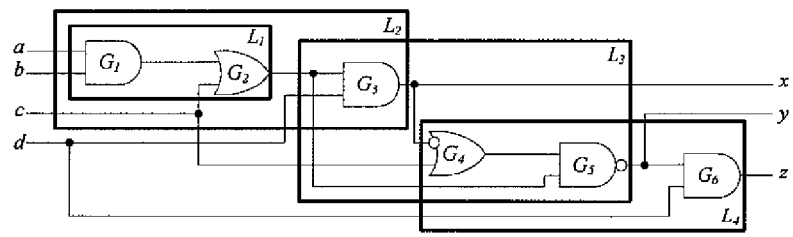
FIG. 7 demonstrates an example of minimum TFI cone.

For example, in FIG. 6, $G_3 \rightarrow G_7$ is to be added to make $G_1 \rightarrow G_5$ redundant and removable. Considering $M_1=\{G_1, G_2\}$, $M_2=\{G_6, f\}$, K=4, and $|M_1+M_2|=K$, $L_5$ can be expanded by connecting $M_1$ ($G_1$ and $G_2$) to the duplicated logic $G_3$ inside $L_5$. Thus, the transformation is completed by updating the mapping of $L_5$ with the connection of two new wires without any LUT addition. As shown in FIG. 7, after technology mapping, some gates may be duplicated inside several LUTs, therefore a gate can have more than one TFI cone. Obviously, if this gate is the source node u of the alternative wire u→v, then choosing this gate's smallest related input set, the minimum TFI cone, might increase the chance of successfully expanding all LUTs containing v. For example, in FIG. 7, $G_4$ is duplicated in $L_3$ and $L_4$. Its TFI cone in $L_3$, $Cone_3$, contains $G_3$ and $G_4$ with the input set $\{G_2, c, d\}$. Whereas the TFI cone of $G_4$ in $L_4$, Cone$_4$, only contains $G_4$ with the input set $\{G_3, c\}$. So the minimum TFI cone of $G_4$ is $\{G_3, c\}$. When an alternative wire starting from $G_4$ is to be added, $G_3$ and c will be connected to all LUTs containing its sink node.

Figure 9:
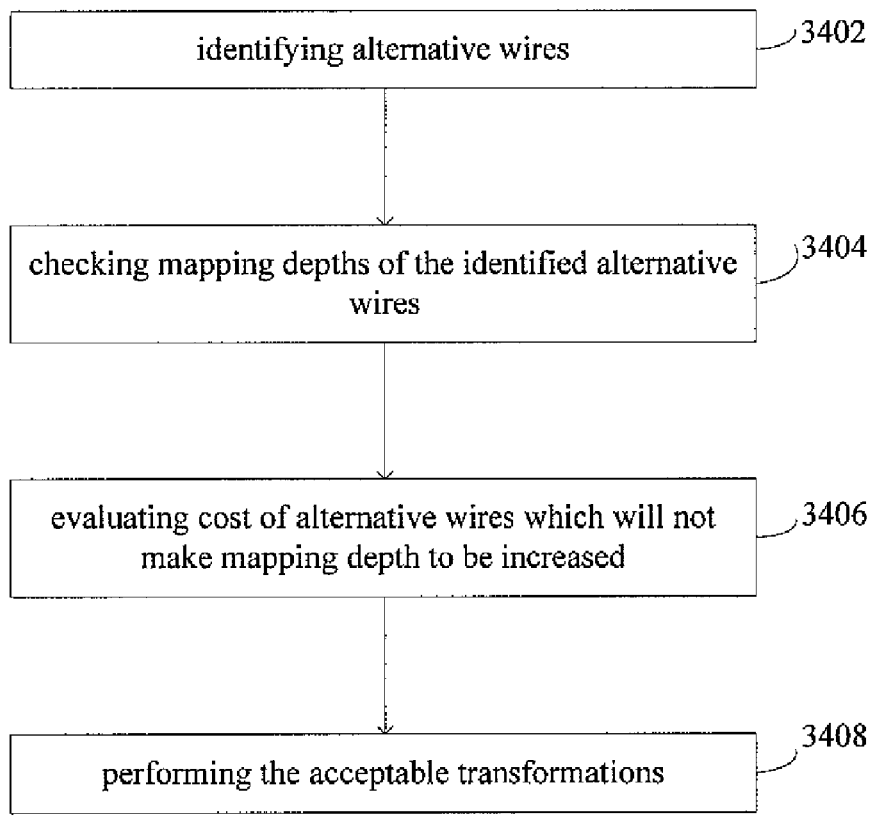
FIG. 9 demonstrates a detailed process for the step of rewiring of FIG. 8.

Referring to FIG. 9, there is shown a detailed process of the rewiring 3041 of the third circuit according to one embodiment. At step 3402, alternative wires for a target wire are identified. At step 3404, mapping depths of the circuit when each of the identified alternative wires is added into the circuit are checked to determine the alternative wires which will not increase the mapping depth. At step 3406, wire replacing costs of the determined alternative wires are evaluated to select the alternative wires that can best improve FPGA delay performance. Then, the target wire is replaced by the selected alternative wire at step 3408.

At step 3406, Equation (2) is used to evaluate the determined alternative wires. This cost function reflects the cost contribution from the netlist by exploring its bounding box inside the placement. If a determined alternative wire costs more than the target net, it will be discarded; otherwise, the transformation will be performed.

$$\text{Cost} = \sum_{i=1}^{N_{nets}} q(i) \left[ \frac{bb_x(i)}{C_{av,x}(i)^\beta} + \frac{bb_y(i)}{C_{av,y}(i)^\beta} \right] \quad (2)$$

In Equation (2), $N_{nets}$ is the total number of nets of a circuit. $bb_x(i)$ and $bb_y(i)$ denote horizontal and vertical spans of net i's bounding box, respectively. $C_{av,x}(i)$ and $C_{av,y}(i)$ indicate an average channel capacity in the horizontal and vertical directions over the bounding box of net i, respectively. $\beta$ is used to adjust a relative cost of using narrow and wide channels. The larger the value $\beta$ is, the more wiring in narrow channels is penalized relative to wiring in wider channels. Preferably, $\beta=1$ results in the highest quality placements. A parameter q(i) is used to approximate routing resource demands inside the bounding box and represents a net weight. Its value depends on the number of terminals on net i as Table 1 shows.

TABLE 1

| NUMBER OF TERMINALS VS. NET WEIGHT | |
|---|---|
| # of Terminals | Net weight q |
| 1-3 | 1.0000 |
| 4 | 1.0828 |
| 5 | 1.1536 |
| 6 | 1.2206 |
| 7 | 1.2823 |
| 8 | 1.3385 |
| 9 | 1.3991 |
| 10 | 1.4493 |
| 15 | 1.6899 |
| 20 | 1.8924 |
| 25 | 2.0743 |
| 30 | 2.2334 |
| 35 | 2.3895 |
| 40 | 2.5356 |

TABLE 1-continued

| NUMBER OF TERMINALS VS. NET WEIGHT | |
|---|---|
| # of Terminals | Net weight q |
| 45 | 2.6625 |
| 50 | 2.7933 |

Hereinafter, a system 1000 for FPGA rewiring will be discussed.

Figure 10:
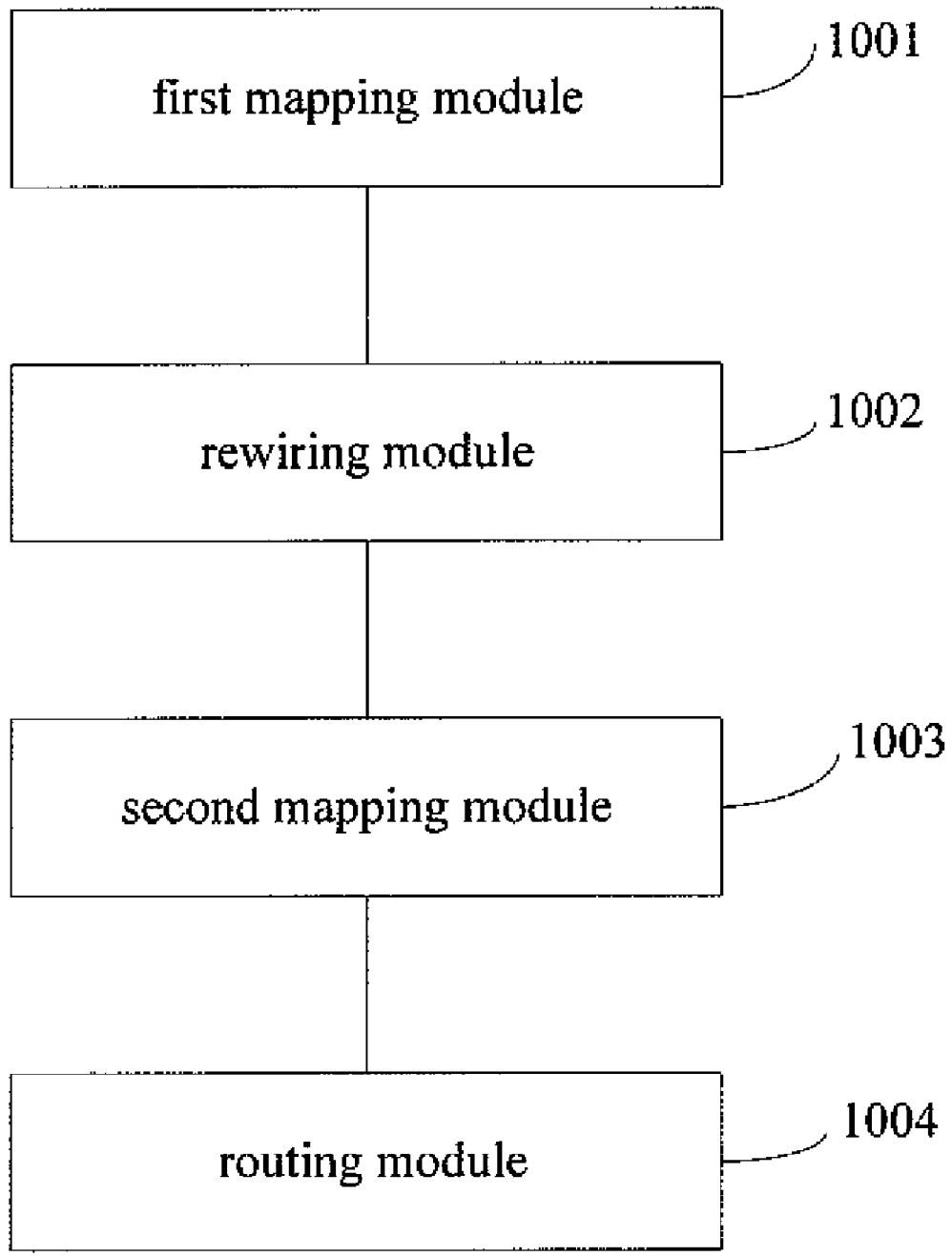
FIG. 10 demonstrates a block diagram of the FPGA rewiring system according to another embodiment.

As shown in FIG. 10, the system 1000 comprises a first mapping module 1001 configured to map the circuit into a first circuit; a rewiring module 1002 configured to rewire the first circuit to obtain a second circuit, a mapping area of the second circuit being less than that of the first circuit; a second mapping module 1003 configured to map the second circuit into a third circuit; and a routing module 1004 configured to route the third circuit to generate an FPGA architecture file related to the circuit.

Figure 11:
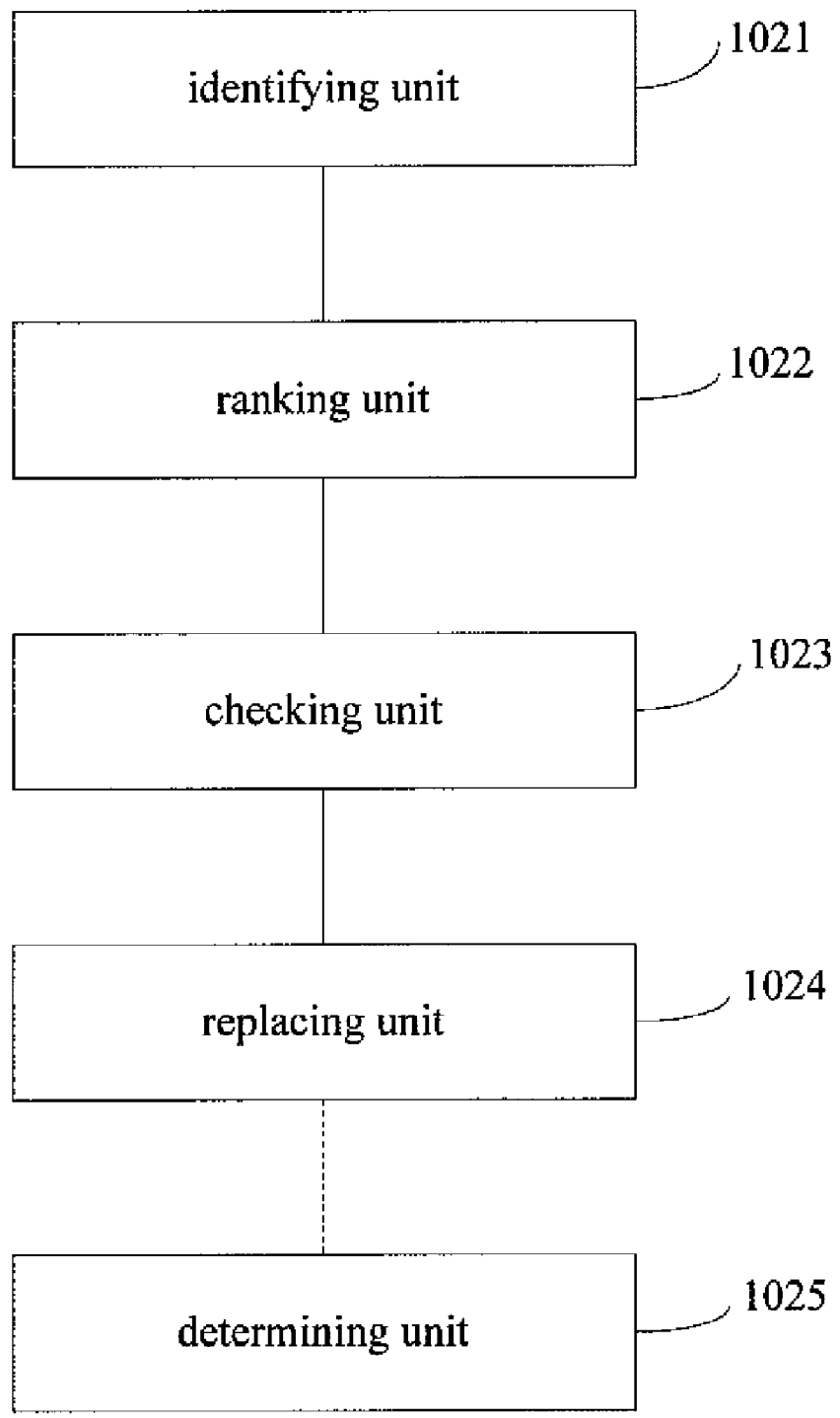
FIG. 11 demonstrates a block diagram of the rewiring module in FIG. 10.

As shown in FIG. 11, the first rewiring module 1002 comprises an identifying unit 1021 configured to identify an alternative wire for each of target wires in the first circuit, each identified alternative wire and a respective target wire forming a transformation; a ranking unit 1022 configured to rank all the transformations; a checking unit 1023 configured to check the ranked transformations sequentially to determine transformations which will reduce the mapping area of the first circuit; and a replacing unit 1024 configured to replace the target wires with respective alternative wires in the determined transformations to generate the second circuit. The first rewiring module 1002 may further comprise a determining unit 1025 configured to determine if a certain number of the ranked transformations are futile in reducing the mapping area. Alternatively, the determining unit 1025 is configured to determine if all the ranked transformations are checked.

Figure 12:
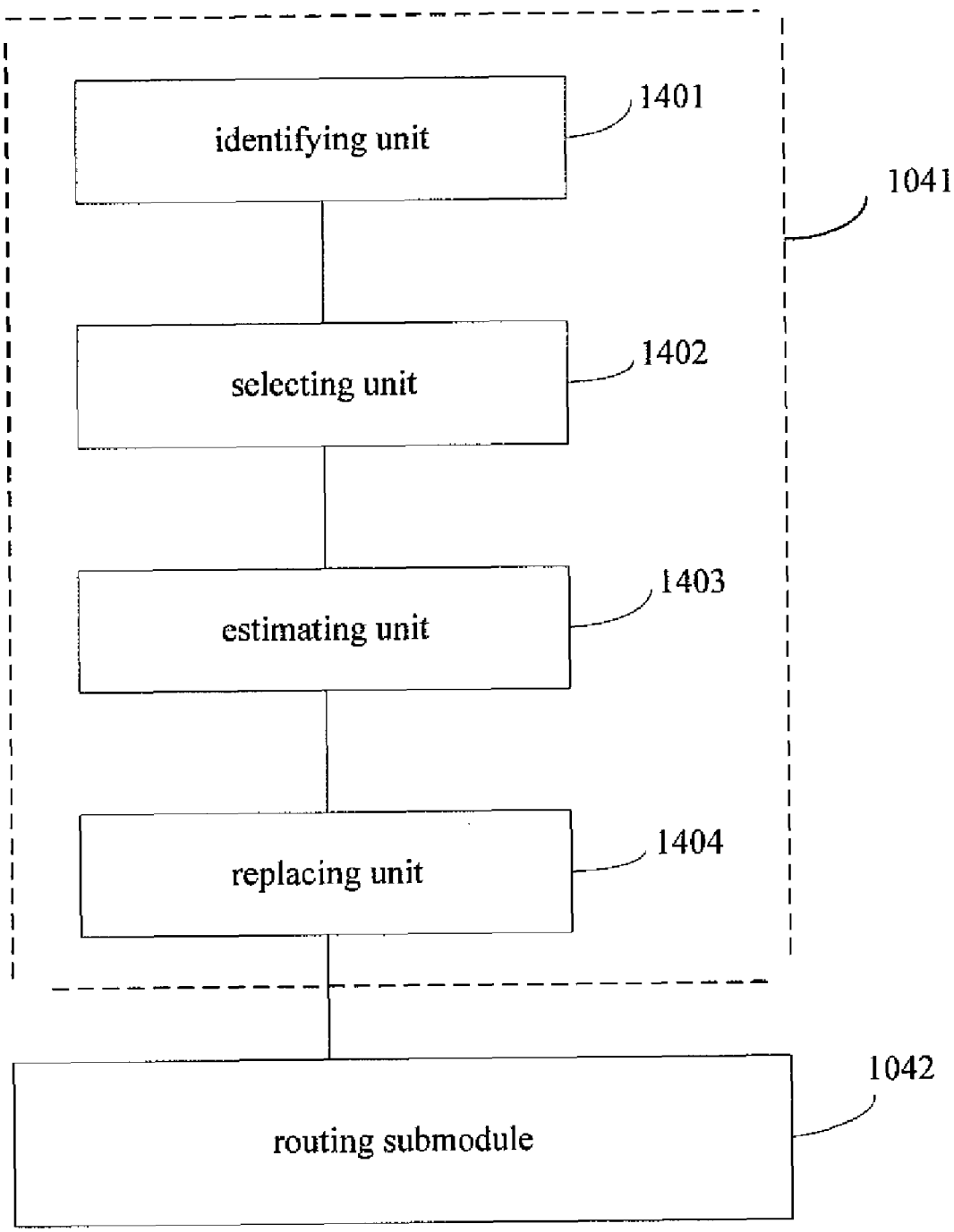
FIG. 12 demonstrates a block diagram of the routing module in FIG. 10.

As shown in FIG. 12, the second rewiring module 1004 may comprise a rewiring submodule 1041 configured to rewire the third circuit to obtain a rewired circuit, a critical path delay of the rewired circuit being less than that of the third circuit; and a routing submodule 1042 configured to route the rewired circuit to generate the FPGA architecture file. The routing submodule 1042 comprises an identifying unit 1401 configured to identify an alternative wire for each of target wires to be replaced in the routed circuit; a selecting unit 1402 configured to select a first set of alternative wires which will not increase a mapping depth of the routing result from the identified alternative wires; an estimating unit 1403 configured to estimate costs of the first set of alternative wires to determine a second set of alternative wires; and a replacing unit 1404 configured to replace the target wires with the second set of alternative wires. The costs of the second set of alternative wires are equal to or less than those of target wires corresponding to the second set of alternative wires.

Experiments are conducted on the following three flows with rewiring injected differently to find out the respective effectiveness margins. (1) DAOmap→Rewiring→TVPR; (2) DAOmap→TVPR→Rewiring; and (3) DAOmap→Rewiring→TVPR→Rewiring. In the experiments, the FPGA rewiring method and system are implemented in C language. The experimental platform is a 3.2 GHz Linux machine with 1 GB memory. All the benchmark circuits are mapped into 4-input LUTs, and each CLB contains one LUT. Hereinafter, the experimental results for the above-mentioned three situations are described respectively.

Table 2 shows the effects of the flow (1) DAOmap→Rewiring→TVPR. This approach provides a reduction upon the DAOmap mapping results of nearly 10% in LUTs.

TABLE 2

Rewiring-based technology mapping's impact on FPGA area and delay performance (K = 4)

| | # CLBs | | | # Slots | | | Routing Area | | | Critical Path Delay (e−08 s) | | |
|---|---|---|---|---|---|---|---|---|---|---|---|---|
| Circuit | no RW | TM + RW | Red. (%) | no RW | TM + RW | Red. (%) | no RW | TM + RW | Red. (%) | no RW | TM + RW | Red. (%) |
| 5xp1 | 36 | 33 | 8.33 | 36 | 36 | 0 | 48685.7 | 48685.7 | 0 | 2.49 | 1.82 | 26.90 |
| C1355 | 80 | 78 | 2.50 | 100 | 100 | 0 | 192733 | 192733 | 0 | 3.41 | 3.29 | 3.52 |
| C1908 | 133 | 122 | 8.27 | 144 | 144 | 0 | 274493 | 317414 | −15.64 | 4.99 | 5.03 | −0.80 |
| C6288 | 979 | 649 | 33.71 | 1024 | 676 | 33.98 | 1882590 | 1053290 | 44.05 | 14.22 | 13.50 | 5.06 |
| C880 | 120 | 119 | 0.83 | 121 | 121 | 0 | 231817 | 231817 | 0 | 4.11 | 4.26 | −3.65 |
| alu2 | 158 | 130 | 7.59 | 169 | 144 | 14.79 | 320762 | 274493 | 14.42 | 5.00 | 5.47 | −9.4 |
| apex6 | 240 | 220 | 8.33 | 900 | 900 | 0 | 1657100 | 1397080 | 15.69 | 3.97 | 4.32 | −8.82 |
| Comp | 32 | 30 | 6.25 | 36 | 36 | 0 | 37438.3 | 48685.7 | −30.04 | 3.06 | 2.75 | 10.13 |
| duke2 | 153 | 135 | 11.76 | 169 | 144 | 14.79 | 320762 | 317414 | 1.04 | 3.77 | 3.09 | 18.04 |
| f51m | 42 | 39 | 7.14 | 49 | 49 | 0 | 65304.4 | 65304.4 | 0 | 2.17 | 2.17 | 0 |
| pcler8 | 38 | 37 | 2.63 | 49 | 49 | 0 | 65304.4 | 65304.4 | 0 | 1.87 | 2.11 | −12.83 |
| term1 | 70 | 59 | 15.71 | 81 | 64 | 20.99 | 105786 | 105802 | −0.01 | 2.29 | 2.61 | −13.97 |
| ttt2 | 64 | 56 | 12.5 | 64 | 64 | 0 | 105802 | 105802 | 0 | 2.49 | 2.05 | 17.67 |
| x3 | 243 | 224 | 7.82 | 900 | 900 | 0 | 1397080 | 1397080 | 0 | 3.80 | 4.00 | −5.26 |
| Average | | | 9.53 | | | 6.04 | | | 2.11 | | | 1.90 |

RW: Rewiring
TM: technology mapping
Red.: reduction

For some benchmark circuits, as some LUTs are removed, fewer nets and shorter critical paths can cause direct delay reduction. While for some circuits in which no LUT is removed from the critical paths, transformations outside may also cause a new topology requiring even longer new critical path after placement, which is why these circuits get slight delay penalty along with area reduction. Another reason for delay increase is that when the number of LUTs in a circuit is reduced a lot, the FPGA architecture may become much tighter. As the channel width is not raised, the high channel density makes some nets take longer routing paths.

The above analysis reveals that logic perturbation in technology mapping is an efficient way to reduce FPGA area by removing LUTs, but does not promise delay performance improvement because of the lack of accurate layout information at this stage.

Table 3 shows the effects of the flow (2) DAOmap→TVPR→Rewiring. Column 2-4 show that 3.7% of all nets are replaced by their alternative wires for routing improvement. Although rewiring can find much more alternative wires according to [6], only a small part of them are useful in delay reduction. Column 8-10 are the comparison results of critical path delay. At the same time the comparison results of channel width are included in Column 5-7. The channel width of C1908 is reduced by one after seven transformations. We do not include it in delay comparison because the delay of a circuit is very likely increased if the circuit is routed with a smaller channel width. The average delay reduction is more than 10%. From Column 11-13, the CPU time consumed by rewiring is only 5% of the total time for TVPR's placement and routing, which is much faster than the SPFD approach. Because we have different starting set up from SPFD rewiring, we cannot make a direct comparison.

TABLE 3

Rewiring-based routing's impact on FPGA area and delay performance (K = 4)

| | | | Ratio | Channel Width | | | Critical Path Delay (e−08 s) | | | CPU Time (s) | | |
|---|---|---|---|---|---|---|---|---|---|---|---|---|
| Circuit | #Nets | #Trans. | % | no RW | RT + RW | Red. (%) | no RW | RT + RW | Red. (%) | VPR | Engine | Ratio |
| 5xp1 | 43 | 2 | 4.65 | 4 | 4 | 0 | 2.49 | 1.70 | 31.74 | 1.31 | 0.12 | 0.09 |
| C1355 | 121 | 0 | 0 | 6 | 6 | 0 | 3.41 | 3.41 | 0 | 10.03 | 0.07 | 0.07 |
| C1908 | 166 | 7 | 4.22 | 7 | 6 | 14.29 | 4.99 | 5.59 | — | 6.56 | 0.41 | 0.06 |
| C6288 | 1011 | 0 | 0 | 5 | 5 | 0 | 14.22 | 14.22 | 0 | 139.90 | 0.98 | 0.01 |
| C880 | 180 | 6 | 3.33 | 6 | 6 | 0 | 4.11 | 3.48 | 15.33 | 13.81 | 0.19 | 0.01 |
| alu2 | 168 | 18 | 10.71 | 6 | 6 | 0 | 5.00 | 4.79 | 4.15 | 30.65 | 2.59 | 0.08 |
| apex6 | 375 | 0 | 0 | 5 | 5 | 0 | 3.97 | 3.97 | 0 | 101.65 | 2.33 | 0.02 |
| comp | 64 | 2 | 3.13 | 3 | 3 | 0 | 3.06 | 2.47 | 19.37 | 1.30 | 0.03 | 0.02 |
| duke2 | 175 | 6 | 3.43 | 6 | 6 | 0 | 3.77 | 3.30 | 12.57 | 25.18 | 1.87 | 0.07 |
| f51m | 50 | 1 | 2.00 | 4 | 4 | 0 | 2.17 | 1.93 | 11.06 | 1.60 | 0.20 | 0.12 |
| pcler8 | 65 | 0 | 0 | 4 | 4 | 0 | 1.87 | 1.87 | 0 | 1.34 | 0.02 | 0.01 |
| term1 | 104 | 11 | 10.58 | 5 | 5 | 0 | 2.29 | 1.99 | 12.91 | 4.74 | 0.24 | 0.05 |

TABLE 3-continued

Rewiring-based routing's impact on FPGA area and delay performance (K = 4)

| Circuit | #Nets | #Trans. | Ratio % | Channel Width no RW | Channel Width RT + RW | Red. (%) | Critical Path Delay (e−08 s) no RW | Critical Path Delay (e−08 s) RT + RW | Red. (%) | CPU Time (s) VPR | CPU Time (s) Engine | CPU Time (s) Ratio |
|---|---|---|---|---|---|---|---|---|---|---|---|---|
| ttt2 | 88 | 7 | 7.95 | 4 | 4 | 0 | 2.49 | 1.81 | 27.11 | 3.44 | 0.14 | 0.04 |
| x3 | 378 | 6 | 1.59 | 5 | 5 | 0 | 3.80 | 3.68 | 3.10 | 71.20 | 1.62 | 0.02 |
| Average | | | 3.69 | | | 1.02 | | | 10.56 | | | 0.05 |

Trans.: transformation
RW: rewiring
RT: routing
Red.: reduction

To the best of our knowledge, this is the first work giving quantitative analysis on the power of the ATPG-based rewiring techniques when applied in LUT-based FPGA routing. This part of work reveals that rewiring is powerful in delay reduction, especially under very low CPU overhead and without area penalty. Considering its high efficiency in area reduction in technology mapping, we believe that rewiring is a strong tool for postlayout logic synthesis to improve FPGA performance and routability. Most importantly, it is known that any effective delay reduction scheme is relying on the accuracy of physical layout information, which is not available until routing is completed. That is why the delay performance cannot be improved in rewiring-based technology mapping according to the experiments of rewiring for technology mapping only.

Table 4 reflects the results for applying flow (3) DAOmap→Rewiring→TVPR→Rewiring. It shows that applying rewiring on both stages, though reduces LUTs by 10% too and reduces (routing) area by 3% but the delay reduction in only 3.8%, which is worse than the flow (2). As most FPGA chips do not down-scale sizes continuously, LUT reductions do not always bring routing area reductions proportionally (e.g. 10% LUT reduction only brings 3.8% routing area reduction). This result also implies an anomaly point: it is not necessarily true that a best technology mapping always yields a best final routing result. Therefore, we may need an EDA flow with more stages integrated together and a powerful logic perturbation tool to shift optimization resources between them for a globally best final solution.

TABLE 4

Performing logic perturbation on technology mapping and routing to affect FPGA area and delay

| Circuit | Channel Width RW + TM | Channel Width (TM + RT) + RW | Red. (%) | Critical Path Delay no RW | Critical Path Delay (TM + RT) + RW | Red. (%) |
|---|---|---|---|---|---|---|
| 5xp1 | 4 | 4 | 0 | 2.49 | 1.93 | 22.49 |
| C1355 | 6 | 6 | 0 | 3.41 | 3.41 | 0 |
| C2670 | 6 | 5 | 16.67 | 6.66 | 5.47 | 17.87 |
| C880 | 6 | 6 | 0 | 3.60 | 3.60 | 0 |
| alu2 | 6 | 6 | 0 | 5.00 | 5.00 | 0 |
| b9_n2 | 4 | 4 | 0 | 2.08 | 2.08 | 0 |
| f51m | 4 | 4 | 0 | 2.17 | 2.17 | 0 |
| misex3 | 6 | 6 | 0 | 5.03 | 5.45 | −8.35 |
| pcler8 | 4 | 4 | 0 | 1.87 | 1.87 | 0 |
| term1 | 5 | 5 | 0 | 2.29 | 2.29 | 0 |
| ttt2 | 5 | 4 | 20.00 | 2.49 | 2.05 | 17.67 |
| x3 | 5 | 5 | 0 | 3.80 | 3.98 | −4.74 |
| Average | | | 3.06 | | | 3.75 |

RW: rewiring
TM: technology mapping
RT: routing
Red.: reduction

In view of the above, following conclusions can be obtained. As is known, area and delay are the two core issues for FPGA designs. However, the area optimization is mainly attributed to the technology mapping stage while the delay can only be correctly handled in the final routing stage. Optimizing both simultaneously has always imposed a tough challenge to us. In this disclosure, we further show that in a conventional EDA flow divided into several stages, a best result obtained in a certain stage according to its cost function may not necessarily be the best for later stages. In today's commonly adopted FPGA design flows, a technology mapping result with fewer LUTs may adversely yield a routing with one or more tracks. As a result it may be useful to have a design flow being able to shift optimization resources across boundaries between different stages and a universal technique applicable to all stages would be worthwhile to develop. As rewiring is a both physical- and logical-information sensitive transformation technique that can be universally adaptable to nearly most EDA stages, it makes a good sense for us to design a flow with rewiring integrated into all stages, from netlist to final routing, and analyze its impact margins on the various stages.

As a first known effort of this kind, our experimental results show that the rewiring logic perturbation can still bring large improvements on area and delay simultaneously, under acceptable CPU overhead and no penalty of other objectives. Compared with the already excellent DAOmap+TVPR results, we can reduce the number of LUTs by up to 33.7% (avg. 10%) and critical path delay by up to 31.7% (avg. 11%), which is a result with practical significance too. In the future, we would like to improve the speed of the rewiring engine and further extend the flow to allow for more resource shifting flexibility between different stages. And as a longer term goal, to investigate a new flow with all stages merged together under the help of rewiring technique. According to our current experimental results, this direction seems promising. The final results show that an efficient scheme can obtain a good trade-off for low CPU run time and significant improvements.

What is claimed is:

1. A method of FPGA rewiring of a circuit by using a computer, comprising:
   mapping the circuit into a first circuit, wherein the first circuit is logically represented with a plurality of look-up tables;
   rewiring the first circuit to obtain a second circuit, wherein a mapping area of the second circuit is less than that of the first circuit;
   mapping the second circuit into a third circuit, wherein the third circuit is logically represented with less look-up tables than the first circuit; and
   routing the third circuit to generate a FPGA architecture file related to the circuit,
   wherein the circuit is able to be re-constructed based on, at least in part, the generated file, and
   wherein the rewiring of the first circuit comprising:
   identifying a plurality of transformations in the first circuit, wherein each of the transformations comprises an alternative wire and a target wire;
   ranking all the identified transformations;
   checking the ranked transformations sequentially to determine transformations which will reduce the mapping area of the first circuit; and
   replacing each of the target wires with respective alternative wires in each of the determined transformations to generate the second circuit,
   wherein the method is, at least in part, performed using a computer.

2. The method of claim 1, wherein the identified transformations are ranked in a descending order of scores determined by a rule of $af(w_a)-af(w_t)$, in which $w_a$ is an alternative wire and $w_t$ is a target wire, $$af(v) = A_v + \sum_{u \in input(v)} af(u)$$

is an area flow of a sink node v, u represents a source node associated with the node v, $A_v$ is the constant area of a gate v, af(u) is the area flow of gate u calculated from its fanins, and the area flow of primary inputs is 0.

3. The method of claim 1, the rewiring of the first circuit further comprising:
   determining if a certain number of the ranked transformations are futile in reducing the mapping area and terminating the rewiring of the first circuit based on, at least in part, the certain number.

4. The method of claim 1, the rewiring of the first circuit further comprising:
   determining if all the ranked transformations are checked and terminating the rewiring of the first circuit of all the ranked transformations are checked.

5. The method of claim 1, the routing of the third circuit comprising:
   rewiring the third circuit so as to reduce a critical path delay of the third circuit; and
   routing the rewired circuit to generate the FPGA architecture file.

6. The method of claim 5, the rewiring of the third circuit comprising:
   identifying an alternative wire for each of target wires in the third circuit;
   selecting a first set of alternative wires which will not increase a mapping depth of the third circuit from the identified alternative wires;
   estimating costs of the first set of alternative wires to determine a second set of alternative wires; and
   replacing the target wires with the second set of alternative wires,
   wherein the costs of the second set of alternative wires are equal to or less than those of respective target wires.

7. The method of claim 6, wherein the alternative wire for each of target wires is identified such that no extra LUT will be introduced after the step of replacing is carried out.

8. The method of claim 6, wherein the costs are calculated by:

$$\text{Cost} = \sum_{i=1}^{N_{nets}} q(i) \left[ \frac{bb_x(i)}{C_{av,x}(i)^\beta} + \frac{bb_y(i)}{C_{av,y}(i)^\beta} \right]$$

wherein $N_{nets}$ is the total number of the nets, $bb_x(i)$ and $bb_y(i)$ denote horizontal and vertical spans of net i's bounding box, respectively, $C_{av,x}(i)$ and $C_{av,y}(i)$ indicate an average channel capacity in horizontal and vertical directions over the bounding box of net i, respectively, $\beta$ is used to adjust a relative cost of using narrow and wide channels, and q(i) is used to approximate routing resource demands inside the bounding box and represents a net weight.

9. A system for FPGA rewiring of a circuit, comprising:
   a first mapping module configured to map the circuit into a first circuit, wherein the first circuit is logically represented with a plurality of look-up tables;
   a rewiring module configured to rewire the first circuit to obtain a second circuit, wherein a mapping area of the second circuit is less than that of the first circuit;
   a second mapping module configured to map the second circuit into a third circuit, wherein the third circuit is logically represented with less look-up tables than the first circuit; and
   a routing module configured to route the third circuit to generate a FPGA architecture file related to the circuit,
   wherein the circuit is able to be re-constructed based on the generated file, and
   wherein the rewiring module further comprises:
   an identifying unit configured to identify a plurality of transformations in the first circuit, wherein each of the transformations comprises an alternative wire and a target wire;
   a ranking unit configured to rank all the transformations;
   a checking unit configured to check the ranked transformations sequentially to determine transformations which will reduce the mapping area of the first circuit; and
   a replacing unit configured to replace the target wires with respective alternative wires in the determined transformations to generate the second circuit.

13

10. The system of claim 9, wherein the identified transformations are ranked in a descending order of scores determined by a rule of $af(w_a)-af(w_t)$, in which $w_a$ is an alternative wire and $w_t$ is a target wire, $$af(v) = A_v + \sum_{u \in input(v)} af(u)$$

is an area flow of a sink node v, u represents a source node associated with the node v, $A_v$ is the constant area of a gate v, af(u) is the area flow of gate u calculated from its fanins, and the area flow of primary inputs is 0.

11. The system of claim 9, wherein the rewiring module further comprises:
a determining unit configured to determine if a certain number of the ranked transformations are futile in reducing the mapping area.

12. The system of claim 9, wherein the rewiring module further comprises:
a determining unit configured to determine if all the ranked transformations are checked.

13. The system of claim 9, the wherein routing module further comprises:
a rewiring submodule configured to rewire the third circuit so as to reduce a critical path delay of the third circuit; and
a routing submodule configured to route the rewired circuit to generate the FPGA architecture file.

14. The system of claim 13, wherein the rewiring submodule further comprises:
an identifying unit configured to identify an alternative wire for each of target wires in the third circuit;
a selecting unit configured to select a first set of alternative wires which will not increase a mapping depth of the third circuit from the identified alternative wires;
an estimating unit configured to estimate costs of the first set of alternative wires to determine a second set of alternative wires; and
a replacing unit configured to replace the target wires with the second set of alternative wires,
wherein the costs of the second set of alternative wires are equal to or less than those of respective target wires.

15. The system of claim 14, wherein the identifying unit is configured such that the alternative wire for each of target wires is identified so that an extra LUT will not be introduced after the replacing is carried out.

16. The system of claim 14, wherein the costs are calculated by:

$$Cost = \sum_{i=1}^{N_{nets}} q(i) \left[ \frac{bb_x(i)}{C_{av,x}(i)^\beta} + \frac{bb_y(i)}{C_{av,y}(i)^\beta} \right]$$

wherein $N_{nets}$ is the total number of the nets, $bb_x(i)$ and $bb_y(i)$ denote horizontal and vertical spans of net i's bounding box, respectively, $C_{av,x}(i)$ and $C_{av,y}(i)$ indicate an average channel capacity in horizontal and vertical directions over the bounding box of net i, respectively, $\beta$ is used to adjust a relative cost of using narrow and wide channels, and q(i) is used to approximate routing resource demands inside the bounding box and represents a net weight.

14

17. A system for FPGA rewiring of a circuit, comprising:
means for mapping the circuit into a first circuit, wherein the first circuit is logically represented with a plurality of look-up tables;
means for rewiring the first circuit to obtain a second circuit, wherein a mapping area of the second circuit is less than that of the first circuit;
means for mapping the second circuit into a third circuit, wherein the third circuit is logically represented with less look-up tables than the first circuit; and
means for routing the third circuit to generate a FPGA architecture file related to the circuit,
wherein the circuit is able to be re-constructed based on the generated file, and
wherein the rewiring means comprising:
means for indentifying an alternative wire for each of target wires in the first circuit, each indentified alternative wire and a representative target wire forming a transformation;
means for ranking all the identified transformations;
means for checking the ranked transformations sequentially to determine transformations which will reduce the mapping area of the first circuit; and
means for replacing the target wires with respective alternative wires in the determined transformations to generate the second circuit.

18. The system of claim 17, wherein the identified transformations are ranked in a descending order of scores determined by a rule of $af(w_a)-af(w_t)$, in which $w_a$ is an alternative wire and $w_t$ is a target wire, $$af(v) = A_v + \sum_{u \in input(v)} af(u)$$

is an area flow of a sink node v, u represents a source node associated with the node v, $A_v$ is the constant area of a gate v, af(u) is the area flow of gate u calculated from its fanins, and the area flow of primary inputs is 0.

19. The system of claim 18, the means for rewiring comprising:
means for determining if a certain number of the ranked transformations are futile in reducing the mapping area.

20. The system of claim 18, the means for rewiring further comprising:
means for determining if all the ranked transformations are checked.

21. The system of claim 17, the means for the routing comprising:
means for rewiring the third circuit so as to reduce a critical path delay of the third circuit; and
means for routing the rewired circuit to generate the FPGA architecture file.

22. The system of claim 21, the means for rewiring the third circuit so as to reduce a critical path delay of the third circuit further comprising:
means for identifying an alternative wire for each of target wires in the third circuit;
means for selecting a first set of alternative wires which will not increase a mapping depth of the third circuit from the identified alternative wires;
means for estimating costs of the first set of alternative wires to determine a second set of alternative wires; and
means for replacing the target wires with the second set of alternative wires,
wherein the costs of the second set of alternative wires are equal to or less than those of respective target wires.

23. The system of claim 22, wherein means for identifying is configured such that the alternative wire for each of target wires is identified so that an extra LUT will not be introduced after the replacing is carried out.

24. The system of claim 22, wherein the costs are calculated by:

$$Cost = \sum_{i=1}^{N_{nets}} q(i) \left[ \frac{bb_x(i)}{C_{av,x}(i)^\beta} + \frac{bb_y(i)}{C_{av,y}(i)^\beta} \right]$$

wherein $N_{nets}$ is the total number of the nets, $bb_x(i)$ and $bb_y(i)$ denote horizontal and vertical spans of net i's bounding box, respectively, $C_{av,x}(i)$ and $C_{av,y}(i)$ indicate an average channel capacity in horizontal and vertical directions over the bounding box of net i, respectively, $\beta$ is used to adjust a relative cost of using narrow and wide channels, and q(i) is used to approximate routing resource demands inside the bounding box and represents a net weight.

* * * * *

UNITED STATES PATENT AND TRADEMARK OFFICE
CERTIFICATE OF CORRECTION

Page 1 of 1

PATENT NO. : 8,042,083 B2
APPLICATION NO. : 12/472210
DATED : October 18, 2011
INVENTOR(S) : Wu et al.

It is certified that error appears in the above-identified patent and that said Letters Patent is hereby corrected as shown below:

| Issued Patent | | Description of Discrepancy |
|---|---|---|
| Column | Line | |
| (Item 56) Page 2 Col. 1 | 7 | Under Other Publications, change "Greak" to --Great--. |
| (Item 56) Page 2 Col. 1 | 15 | Under Other Publications, change "IEE" to --IEEE--. |
| 4 | 1 | Change "af(u) af(v)." to --af(u)-af(v).--. |
| 10 | 46 | Change "result" to --result,--. |
| 10 | 49 | Change "he" to --be--. |
| 11 | 60 | In Claim 4, change "of all" to --if all--. |
| 13 | 24 (Approx.) | In Claim 13, change "the wherein" to --wherein the--. |
| 14 | 17 (Approx.) | In Claim 17, change "representative" to --respective--. |

Signed and Sealed this
Thirty-first Day of July, 2012

David J. Kappos
*Director of the United States Patent and Trademark Office*